United States Patent [19]

Frass et al.

[11] 4,447,510
[45] May 8, 1984

[54] PROCESS FOR PRODUCING RELIEF COPIES IN LIGHT HARDENABLE MATERIALS WITH ULTRASONIC TREATMENT

[75] Inventors: Werner Frass, Wiesbaden; Klaus Horn, Hofheim, both of Fed. Rep. of Germany

[73] Assignee: Hoechst Aktiengesellschaft, Frankfurt am Main, Fed. Rep. of Germany

[21] Appl. No.: 376,008

[22] Filed: May 7, 1982

[30] Foreign Application Priority Data

May 13, 1981 [DE] Fed. Rep. of Germany ....... 3118884

[51] Int. Cl.$^3$ .......................... G03F 7/02; G03F 7/08; G03F 7/26
[52] U.S. Cl. .................................... 430/3; 430/141; 430/145; 430/306; 430/309; 430/325; 430/329; 430/330; 430/347; 134/1; 134/10
[58] Field of Search .................. 430/3, 306, 309, 329, 430/330, 325, 141, 145, 347; 134/1, 10

[56] References Cited

U.S. PATENT DOCUMENTS

| | | | |
|---|---|---|---|
| 3,661,660 | 5/1972 | Wessells et al. | 134/1 |
| 3,849,135 | 11/1974 | Karlikouski et al. | 430/331 |
| 4,131,483 | 12/1978 | Iwahashi et al. | 134/10 |

FOREIGN PATENT DOCUMENTS

| | | | |
|---|---|---|---|
| 1397567 | 6/1975 | United Kingdom | 430/253 |
| 1420958 | 1/1976 | United Kingdom | 430/309 |
| 2075372 | 11/1981 | United Kingdom | 430/3 |

OTHER PUBLICATIONS

Grant, "Hackh's Chemical Dictionary", 4th ed., McGraw-Hill Book Co., 1969, p. 699.
Chemical Abstracts, vol. 73, #115049x, 1970.
Research Disclosure #18345, 7/79.

*Primary Examiner*—Charles L. Bowers, Jr.
*Attorney, Agent, or Firm*—Schwartz, Jeffery, Schwaab, Mack, Blumenthal & Koch

[57] ABSTRACT

A process for producing relief copies wherein the light-hardenable layer of a light-hardenable copying material, which contains a photopolymerizable mixture, a photodimerizable polymeric compound or a diazonium salt polycondensation product, is exposed to a light image, the exposed layer is subjected to a brief ultrasonic treatment, and the unexposed areas of the layer are thereafter washed away by means of a developer. As a result of the ultrasonic treatment, shorter exposure times may be used and better in-depth hardening of the layer may be achieved.

23 Claims, No Drawings

PROCESS FOR PRODUCING RELIEF COPIES IN LIGHT HARDENABLE MATERIALS WITH ULTRASONIC TREATMENT

BACKGROUND OF THE INVENTION

The present invention relates to a process for producing relief copies, in which a light-hardenable copying material comprising a light-sensitive layer which contains a photopolymerizable mixture, a photodimerizable polymeric compound or a negative-acting light-sensitive diazo compound, is exposed imagewise, and the unexposed areas of the layer are thereafter washed away by a developer.

In most cases, such light-hardenable materials, particularly photopolymerizable materials, are not yet fully hardened after exposure to the light image. It has been found that, depending on the time interval between exposure and development, there are distinct differences in the wedge length of copied continuous tone step wedges. These variations are particularly pronounced in cases of exposure with laser light, for example from an argon ion laser.

U.S. patent application Ser. No. 323,050, filed Nov. 19, 1981, now abandoned, discloses one process whereby these disadvantages can be avoided comprising warming the light-sensitive material, during or after exposure, for a short time at an elevated temperature and then developing.

SUMMARY OF THE INVENTION

It is the object of the present invention to provide an improved process for producing relief copies in which a light-hardenable layer comprising a photopolymerizable mixture, a photodimerizable polymeric compound or a negative-acting light-sensitive diazo compound is exposed to a light image and the unexposed areas are removed with a developer.

Another object of the present invention is to provide a process of the aforedescribed type which produces consistent, uniform copies.

It is also an object of the present invention to provide a process of the aforedescribed type in which the copy quality has less tendency to vary depending on the length of time between exposure and development.

A further object of the present invention is to provide a process of the aforedescribed type which achieves more complete hardening of the light-hardenable layer after exposure to light.

An additional object of the present invention is to provide a process of the aforedescribed type which can manage with less exposure.

Yet another object of the present invention is to provide a process of the aforedescribed type which can make effective use of various types of light sources, including laser light.

These and other objects of the invention are achieved by providing a process for producing relief copies comprising exposing the light-hardenable layer of a light-hardenable copying material to a light image, said layer comprising at least one material selected from the group consisting of photopolymerizable mixtures, photodimerizable polymeric compounds and diazonium salt condensation products; subjecting the exposed layer to ultrasonic treatment, and thereafter developing the layer by washing away unexposed areas of the layer with a developer.

DETAILED DESCRIPTION OF THE PREFERRED EMBODIMENTS

The invention is based on a process for the preparation of relief copies, in which the light-hardenable layer of a copying material, which layer contains a photopolymerizable mixture, a photodimerizable polymeric compound or a diazonium salt polycondensation product, is exposed imagewise and thereafter the unexposed areas of the layer are washed away by means of a developer.

The process according to the invention is characterized by subjecting the layer briefly to ultrasonic treatment after exposure and then developing it. The ultrasonic treatment is preferably effected as soon as possible after exposure, i.e., within a period of up to about one hour after exposure. The temperature in the ultrasonic bath should be between 4° and 50° C., preferably between 15° and 30° C. The duration of the ultrasonic treatment can be between 5 seconds and 40 minutes, preferably between 30 seconds and 15 minutes. The shorter the time interval between exposure and ultrasonic treatment, the shorter the duration of the ultrasonic treatment can be.

The ultrasonic treatment can be effected in a known manner, for example by immersing the exposed plates in a commercially available ultrasonic bath such as a USI-G-1500 ultrasonic bath (19–21 kHz, 1500 W) from the firm of Schoeller Schall or a Type 12 ultrasonic bath (50 kHz, 60 W) from the firm of Bransonic.

The light-sensitive materials to be processed by the method of the invention comprise a light-sensitive layer which is preferably disposed on a layer support.

The most preferred light-sensitive layers are photopolymerizable layers. These comprise, as essential constituents, a polymerizable compound having at least two terminal ethylenically unsaturated double bonds, a polymeric binder and a photoinitiator which, under the action of actinic radiation, is capable of initiating free radical polymerization of the ethylenically unsaturated compound. The layer may also comprise stabilizers or inhibitors to prevent dark polymerization of the monomers, hydrogen donors, wetting agents, plasticizers, sensitometric regulators, dyestuffs and colorless or colored pigments.

Many substances are suitable photoinitiators. These include benzoin; benzoin ether; polynuclear quinones such as 2-ethyl-anthraquinone; acridine derivatives such as 9-phenylacridine, 9-p-methoxyphenylacridine, 9-acetylaminoacridine and benz(a)acridine; phenazine derivatives such as 9,10-dimethylbenzo(a)phenazine, 9-methylbenzo(a)phenazine and 10-methoxybenzo(a)phenazine; quinoxaline derivatives such as 6,4',4''-trimethoxy-2,3-diphenylquinoxaline and 4,4''-dimethoxy-2,3-diphenyl-5-azaquinoxaline; quinazoline derivatives; synergistic mixtures of various ketones; dyestuff/redox systems; thiopyrylium salts and the like.

Generally, the photoinitiators are added in an amount of about 0.01 to 10, preferably of about 0.2 to 5 percent by weight, relative to the constituents of the photopolymerizable layer.

Photopolymerizable monomers suitable for use in the invention are known. Some examples are described in U.S. Pat. Nos. 2,760,863 and 3,060,023. Preferred examples include acrylic acid esters and methacrylic acid esters such as diglycerol diacrylate, polyethylene glycol dimethacrylate, and acrylates and methacrylates of trimethylolethane, trimethylolpropane, pentaerythritol and polyhydric alicyclic alcohols. Reaction products of diisocyanates with partial esters of polyhydric alcohols can also be used advantageously. Such monomers are described in German Offenlegungsschrift No. 2,064,079 and German Offenlegungsschrift No. 2,361,041.

The proportion of monomers in the layer is generally about 10 to 80 percent, preferably 20 to 60 percent by weight.

The hydrogen donors used are mainly aliphatic polyethers. Where appropriate, the hydrogen donor function can also be performed by the binder or by the polymerizable monomer, if these possess labile hydrogen atoms.

Many different soluble organic polymers may be used as binders. Suitable examples include polyamides, polyvinyl esters, polyvinyl acetals, polyvinyl ethers, epoxy resins, polyacrylic acid esters, polymethacrylic acid esters, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the aforementioned homopolymers.

Other suitable binders include natural materials or modified natural materials such as gelatin, cellulose ethers and the like.

It is particularly advantageous to use binders which are insoluble in water but are soluble, or at least swellable, in aqueous alkaline solutions, since layers containing such binders can be developed with the preferred aqueous alkaline developers. Such binders can, for example, contain the following groups: —COOH, —PO$_3$H$_2$, —SO$_3$H, —SO$_2$NH—, SO$_2$—NH—CO— and the like. Examples of such binders include maleate resins, polymers of beta-methacryloyloxyethyl N-(p-toly-sulfonyl)-carbamate, and copolymers of these and similar monomers with other monomers, as well as styrene maleic anhydride copolymers. Methyl methacrylate/methacrylic acid copolymers and copolymers of methacrylic acid, alkyl methacrylates and methyl methacrylate and/or styrene acrylonitrile and other monomers, as described in German Offenlegungsschrift No. 2,064,080 and German Offenlegungsschrift No. 2,363,806, are preferred.

The amount of binder is generally about 20 to 90 percent, preferably about 40 to 80 percent, by weight of the constituents of the layer.

It is generally advantageous to substantially shield the photopolymerizable layer from the influence of atmospheric oxygen during the photopolymerization, i.e., above all, to prevent continual diffusion of atmospheric oxygen into the layer. This is particularly important if the process is carried out without a vacuum copying frame as in the case of exposure by projection or exposure by means of laser radiation. If the mixture is used in the form of thin copying layers, it is advisable to apply a suitable covering film having a low permeability to oxygen. This film can be self-supporting and can be peeled off before developing the copying layer. For example, polyester films are suitable for this purpose. The covering film may also be composed of a material which dissolves in the developer liquid or which can be removed during the development, at least in the non-hardened areas. Suitable materials for this purpose include waxes, polyvinyl alcohol, polyphosphates, sugars and the like.

Suitable photodimerizable substances of principal interest include cinnamic acid derivatives, especially cinnamic acid esters of polyhydroxy compounds such as polyvinyl cinnamate. Copying materials of this type are described in British Patent No. 695,197.

Copying materials based on diazonium salt polycondensation products can also be used. Suitable diazonium salt polycondensation products include condensation products of condensable aromatic diazonium salts, such as diphenylamine-4-diazonium salts, with aldehydes, preferably with formaldehyde. It is particularly advantageous to use co-condensation products which in addition to the diazonium salt units also contain other units which are not sensitive to light and which are derived from condensable compounds, especially aromatic amines, phenols, phenol-ethers, aromatic thioethers, aromatic hydrocarbons, aromatic heterocycles and organic acid amides. Such condensation products are described in U.S. Pat. No. 3,867,147. Generally, all diazonium salt polycondensation products described in U.S. Pat. No. 4,186,017 are suitable.

The light-sensitive layers of these copying materials additionally may contain binders, dyestuffs, indicators, pigments, stabilizers, wetting agents and other customary additives. The binders may be water-soluble or water-insoluble. Preferably, water-insoluble resinous binders are used, particularly in combination with the preferred co-condensation products of diazonium salts. Examples of suitable binders include polyalkyl acrylates, methacrylic acid/alkyl methacrylate copolymers, polymers having sulfonylurethane side groups, phenolic resins, urea resins, melamine resins, epoxy resins, polyurethanes, polyvinyl esters and polyvinyl acetals.

The proportion of diazonium salt polycondensation product in the light-sensitive layer is generally about 10 to 100 percent, preferably about 20 to 95 percent, by weight, and the proportion of binder is about 0 to 90 percent, preferably about 5 to 80 percent, by weight, of the total layer.

The nature of the layer support depends on the intended use of the light-sensitive material. To prepare planographic printing plates, aluminium, which preferably carries an anodically produced porous oxide layer, is generally employed. The aluminum is advantageously roughened mechanically, chemically or electrolytically before the anodization. The anodization is carried out in a known manner, for example in sulfuric acid and/or phosphoric acid, preferably under such conditions that an oxide layer weighing about 0.5 to 10 g/m$^2$ is obtained.

Before applying the light-sensitive layer, the oxide layer is advantageously subjected to a pretreatment to improve the printing characteristics, especially the hydrophilic character. For example, the layer may be pretreated with silicates, polyvinylphosphonic acid, hexafluorozirconates, heteropoly acids, tetraalkyl titanates or polyacrylic acids. The coating of the support is carried out in a known manner by spin-coating, by spraying or dipping, by roller application, by extrusion through slot dies, by doctor knife application, or by flow-coating.

In addition to aluminum, there can be used as supports steel, zinc, copper, chromium-plated steel, chromium-plated copper, synthetic polymer films such as films of polyethylene terephthalate or cellulose acetate, or screen-printing supports such as nylon (Perlon) gauze or nickel screens.

The process of the invention is preferably used for producing planographic printing plates. It can also be used to produce gravure printing plates; letterpress, particularly flexographic, printing plates; screen printing stencils; etch resists, and electroplating resists.

The imaging of the copying materials is carried out in a known manner. For example, imaging may be effected by contact exposure under a transparent original. For this, the customary light sources are used, such as carbon arc lamps, xenon lamps, metal halide-modified mercury high pressure lamps and the like.

The imaging can also advantageously be effected with laser light, for example with an argon ion laser. With this type of exposure, a particularly great increase in the exposure effectiveness is achieved by the process of the invention.

Within the scope of the present process, actinic light, i.e., radiation in the region of the near ultraviolet and of short-wave visible light, is generally suitable for image exposure.

The development of the exposed and ultrasonically treated materials is effected in a known manner by washing away the unexposed areas of the layer with a developer. The composition of the developer depends on the nature and solubility of the light-sensitive layer. Suitable developers include organic solvents or solvent mixtures, water, which may contain small amounts of organic solvents or wetting agents, and particularly, alkaline or weakly acidic aqueous solutions, which may contain buffer salts, neutral salts, organic solvents, wetting agents, dyestuffs and other customary additives. Developers which are free from organic solvents are preferred.

The invention has the effect that the hardening of the exposed layer areas is increased to such a degree that the exposure time can be reduced to about half that which is required without untrasonic treatment. In the case of laser irradiation, even greater differences can be achieved. As an additional effect of the ultrasonic treatment, distinctly better in-depth hardening of the exposed areas of the layer occurs. Furthermore, screen areas are developed more cleanly throughout, continuous-tone wedge edges become sharper, and uncrosslinked parts of the layer are developed more rapidly. These advantages particularly manifest themselves in the preparation of printing plates, especially planographic printing plates, where printing is to be effected from the hardened image layer.

The following non-limiting examples illustrate the invention. Parts by weight and parts by volume bear the same relation as grams to milliliters. Parts, percentages and ratios are to be understood as being expressed in terms of weight, unless stated otherwise.

EXAMPLE 1

Electrochemically roughened, anodized aluminum, bearing an oxide layer of 3 g/m$^2$, which had been pretreated with an 0.1% strength aqueous solution of polyvinylphosphonic acid, was used as the layer support for printing plates. The support was coated with a solution having the following composition:
11.7 parts of a 34.7% strength solution of a methyl methacrylate/methacrylic acid copolymer having an acid number of 110 and a mean molecular weight of 35,000, in methyl ethyl ketone,
2.0 parts of the dimethyl ester of hepta-1,6-diene-2,6-dicarboxylic acid,
2.0 parts of trimethylolethane triacrylate,
0.07 part 9-phenylacridine,
0.07 part 4-dimethylamino-4'-methyldibenzalacetone
0.04 part of an azo dyestuff obtained from 2,4-dinitro-6-chlorobenzenediazonium salt and 2-methoxy-5-acetylamino-N-cyanoethyl-N-hydroxyethylaniline,
38.0 parts ethylene glycol monoethyl ether, and
13.5 parts butyl acetate.

The mixture was applied by spin-coating, in such a way as to give a dry weight of 2.8–3 g/m$^2$. The plate was then dried for 2 minutes at 100° C. in a circulating air drying oven.

The plate bearing the light-sensitive layer was overcoated with a 15% strength aqueous solution of polyvinyl alcohol (12% residual acetyl groups, K value 4). After drying, a covering film weighing 4–5 g/m$^2$ was obtained.

The resulting printing plate was exposed for 30 seconds using a 5 kW metal halide lamp at a distance of 110 cm, through a 13 step exposure wedge having density increments of 0.15.

The exposed plate was cut in half. One half was developed immediately, and the other half was passed through a commercial ultrasonic apparatus (USIG 1500 from the firm of Schoeller Schall, Frankfurt, 15–21 kHz, 1500 W), the waterbath of which was warmed to 25° C. The residence time of the plate in the ultrasonic apparatus was 10 minutes.

Thereafter, both halves of the plate were developed in a developer having the following composition:
120 parts sodium metasilicate X 9 H$_2$O,
2.13 parts strontium chloride,
1.2 parts non-ionic wetting agent (coconut fatty alcohol polyoxyethylene ether containing about 8 oxyethylene units),
0.12 part anti-foam agent, and
4,000 parts fully demineralized water.

The plate was acidified with 1% strength phosphoric acid and inked with a fatty printing ink. The following completely crosslinked wedge steps were obtained:

| | |
|---|---|
| With Ultrasonic Treatment | 6 |
| Without Ultrasonic Treatment | 4 |

The printing plate which had been subjected to ultrasonic treatment before development had a life of 210,000 prints, while the plate which had not been so treated had a life of 190,000 prints.

EXAMPLE 2

A layer support as described in Example 1 was spin-coated with a solution having the following composition so as to give a coating weight of 3 g/m$^2$:
11.7 parts of the copolymer solution specified in Example 1,
38.0 parts ethylene glycol monoethyl ether,
13.5 parts butyl acetate,
3.9 parts diethyl ester of hepta-1,6-diene-2,6-di-carboxylic acid,
0.07 part 9-phenylacridine,
0.04 part of the azo dyestuff specified in Example 1, and
0.07 part 4-dimethylamino-4'-methyldibenzalacetone.

Further processing of the plate was effected in the manner described in Example 1.

The following numbers of completely crosslinked wedge steps were obtained with and without ultrasonic treatment:

| | |
|---|---|
| With Ultrasonic Treatment | 7 |

| | |
|---|---|
| (5 minutes at 38° C.) Without Ultrasonic Treatment | 5 |

A printing trial was carried out. For this purpose, the offset printing plate, inked with a fatty ink, was mounted in a commercial printing machine (Heidelberg type GTO). After 200,000 prints, the printing trial was discontinued even though no breaking-off was observed in the 60-line screen.

Comparable results were obtained if, in place of 9-phenylacridine, 2,2-dimethoxy-2-phenylacetophenone or 2-(4-ethoxynaphth-1-yl)-4,6-bistrichloromethyl-s-triazine or 2-(acenaphth-5-yl)-4, 6-bis-trichloromethyl-s-triazine was used.

EXAMPLE 3

A layer support as described in Example 1 was spin-coated with a solution having the following composition, so as to give a coating weight of 3.5 g/m$^2$:
10.0 parts of a 21.7% strength solution of a terpolymer of styrene, n-hexyl methacrylate and methacrylic acid (10:60:30), having an acid number of 190, in butanone,
2.0 parts trimethylolethane triacrylate,
0.06 part 9-phenylacridine, and
0.03 part methyl violet (C.I. 42,535)
in
18.0 parts butanone, and
7.5 parts butyl acetate.

The coated plate was then dried for 2 minutes at 100° C. in a circulating air drying oven, and was provided with a covering film as in Example 1. The plate was exposed through a 13 step exposure wedge, as described in Example 1, for periods of 4, 8, 15 and 30 seconds, and was developed with a developer having the following composition:
5.3 parts sodium metasilicate X 9H$_2$O,
3.4 parts tert.-sodium phosphate X 12 H$_2$O,
0.3 part sec.-sodium phosphate, and
91.0 parts fully demineralized water.

A parallel plate was prepared and exposed in the same way, except directly after exposure it was subjected to an ultrasonic treatment for 15 minutes in water at 22° C. in the ultrasonic apparatus specified in Example 1.

The plates were acidified with 1% strength phosphoric acid and inked with a fatty printing ink. Counting the completely crosslinked gloss steps gave the following results:

| Exposure Time: | | Seconds | | | |
|---|---|---|---|---|---|
| 5 kW MH lamp | | 4 | 8 | 15 | 30 |
| Corresponding fully crosslinked gloss steps | without* | 0 | 1 | 3 | 5 |
| | with* | 1 | 3 | 5 | 7 |

*Ultrasonic treatment for 15 minutes in water at 22° C.

EXAMPLE 4

A printing plate produced as described in Example 3 was exposed for 30 seconds through a 13 step continuous-tone step wedge. Five wedge steps were obtained. Another corresponding plate was exposed for 15 seconds and then subjected to ultrasonic treatment for 5 minutes. Both plates gave 5 hardened wedge steps.

The plates were then used on a commercial printing machine (Heidelberger GTO). The plate which had not been subjected to ultrasonic treatment showed signs of wear after only 150,000 prints, while the plate which had been subjected to ultrasonic treatment showed signs of wear only after 180,000 prints.

EXAMPLE 5

The layer support described in Example 1 was spin-coated with a solution having the following composition so as to give a coating weight of 3.5 g/m$^2$:
2.6 parts diethyl ester of hepta-1,6-diene-2,6-dicarboxylic acid,
6.5 parts styrene/maleic acid ester copolymer having an acid number of 145-160 and a softening point of 140-160° C.,
70.0 parts ethylene glycol monomethyl ether,
0.1 part 9-phenylacridine,
0.035 part azo dyestuff specified in Example 1 and
1.0 part of the reaction product of 1 mole of 2,2,4-trimethylhexamethylene diisocyanate and 2 moles of 2-hydroxyethyl methacrylate.

The coated plate was then dried for 2 minutes at 100° C. in a circulating air drying oven, and was provided with a covering film as in Example 1. The plate was exposed at 200 mW and 1200 L/inch=5.3 mJ/cm$^2$ in a 150 R Laserite ® apparatus from the firm Eocom Corp., equipped with an argon ion laser. The image contrast after irradiation was good. The plate was then developed with the developer from Example 1. The number of fully crosslinked wedge steps of a continuous-tone step wedge was 3, if exposure was immediately followed by development.

If an identical plate was processed in an identical manner, except that the plate was subjected to ultrasonic treatment for 10 minutes in water at 20° C. in an ultrasonic apparatus between exposure and development, 7 wedge steps were obtained.

If the plate was allowed to sit for 1 hour after exposure, and was thereafter subjected to ultrasonic treatment and developed, 7 wedge steps are likewise obtained.

The proof printing and production printing were effected on a Heidelberger GTO offset printing machine with an alcoholic fountain solution, and 150,000 prints were obtained. With the plate which had been subjected to ultrasonic treatment, the number of prints increased to 170,000 sheets.

EXAMPLE 6

(a) An electrochemically roughened and anodized aluminum surface bearing an oxide layer of 3 g/m$^2$ was spin-coated with a solution having the following composition, so as to give a layer weighing 3 g/m$^2$:
11.4 parts of the copolymer solution specified in Example 1,
37.9 parts ethylene glycol monethyl ether,
13.45 parts butyl acetate,
4.0 parts trimethylolethane triacrylate,
0.07 part 4-methylbenzalquinaldine,
0.08 part of the azo dyestuff specified in Example 1,
0.07 part 4-dimethylamino-4'-methyldibenzalacetone, and
0.56 part bis-undecyl disulfide.

The coated plate was dried for 2 minutes at 100° C. in a drying oven.

(b) A further plate was produced in the same manner and was provided with a covering film of 4-5 g/m² of polyvinyl alcohol, as in Example 1.

(c) A third plate was prepared as under (a), but without the addition of bis-undecyl disulfide.

(d) A fourth plate was prepared as under (c) and was provided with a covering layer according to (b).

Samples of the resulting offset printing plates were exposed, by means of a 5 kW metal halide lamp, for 10, 20 and 40 seconds through a 13 step exposure wedge having density increments of 0.15.

One-half of each of the plates described in sections (a) to (d) was passed directly after exposure through the ultrasonic apparatus described in Example 1. The bath temperature was 25° C., and the residence time was 50 seconds. The other half of each plate was not subjected to ultrasonic treatment. Thereafter, all the plates were developed with the developer described in Example 1.

The plates were then acidified with 1% strength phosphoric acid and inked with a fatty printing ink. The following numbers of fully crosslinked wedge steps were obtained:

| Plate | Covering Film | Di-Sulfide | Without Ultrasonic Treatment | | | With Ultrasonic Treatment | | |
|---|---|---|---|---|---|---|---|---|
| | | | 10 | 20 | 40 | 10 | 20 | 40 |
| a | − | + | − | 1 | 3 | − | 1.5 | 3.5 |
| b | + | + | − | 1 | 3 | 1 | 3 | 4 |
| c | − | − | − | − | 2 | − | 1 | 3 |
| d | + | − | − | 1 | 3 | 1 | 3 | 4 |

EXAMPLE 7

In order to demonstrate the broad applicability of the process of the invention, commercial photopolymerizable planographic printing plates (Lydel® Ia from DuPont, and XN from 3M Co.) were exposed for 30 seconds through a continuous-tone wedge and then subjected to an ultrasonic treatment for 30 seconds. Thereafter, the plates were developed with the developers supplied by the manufacturers, in accordance with the applicable instructions. Comparison samples were developed directly without ultrasonic treatment.

The following wedge steps were obtained:

| Lydel Ia | |
|---|---|
| Exposure time (seconds): 30 | |
| Without Ultrasonic Treatment | 7 |
| With Ultrasonic Treatment | 8 |
| XN | |
| Exposure time (seconds): 30 | |
| Without Ultrasonic Treatment | 6 |
| With Ultrasonic Treatment | 7 |

EXAMPLE 8

A solution of
0.6 part polycondensation product of 1 mole of 3-methoxydiphenylamine-4-diazonium salt and 1 mole of 4,4'-bis-methoxymethyldiphenyl ether, the product being isolated as the mesitylene sulfonate,
0.05 part phosphoric acid,
0.27 part Hostaperm Blue B 2 G (C.I. 74,160),
1.87 parts polyvinylformal (Formvar 12/85), and
0.01 part methyl orange,
in
2.2 parts ethylene glycol methyl ether acetate, and
95 parts ethylene glycol monomethyl ether
was applied to the layer support described in Example 1 and dried for 4 minutes at 90° C.

A sample of the resulting printing plate was exposed for 40 seconds through a 13 step exposure wedge and then developed with a solution of:
5.7 parts MgSO₄ X 7 H₂O,
20.2 parts n-propanol,
1 part ethylene glycol monobutyl ether, and
0.7 part ethoxylated alkylphenol,
in
72.4 parts water.

Five fully crosslinked wedge steps were obtained.

A further sample of the same light-sensitive printing plate was exposed as described above, but was subjected to ultrasonic treatment for 10 minutes at 40° C. after exposure. After development, 6-7 wedge steps were obtained.

EXAMPLE 9

A solution of:
7 parts polyvinyl cinnamate,
12.5 parts epoxy resin having an epoxy equivalent weight of 365-420 (Araldite B),
2 parts hydrogenated rosin ester (Staybelite Ester 10),
0.07 part 2-benzoylmethylene-1-methyl-beta-napthothiazoline, and
10 parts Renol Carmin FBB-H (C.I. 12,485),
in
90 parts ethylene glycol ethyl ether acetate
was applied to an electrochemically roughened and anodically oxidized aluminum plate, which was then dried for 3 minutes at 90° C. A part of this plate was exposed through a 13 step exposure wedge for 25 seconds and subsequently developed with a solution of:
43 parts ethylene glycol ethyl ether acetate,
21 parts ethylene glycol monoethyl ether,
15 parts addition product of about 8-12 moles of ethylene oxide with tridecanol,
12.5 parts butyrolactone,
4 parts acetic acid,
3 parts phosphoric acid, and
0.3 part water.

Seven hardened wedge steps were obtained.

A further sample of the light-sensitive printing plate was exposed as described above, but was subjected to ultrasonic treatment for 60 seconds after exposure. After development, 9 hardened wedge steps were obtained.

The foregoing description and examples have been set forth merely to illustrate the invention and are not intended to be limiting. Since modifications of the disclosed embodiments incorporating the spirit and substance of the invention may occur to persons skilled in the art, the scope of the invention is to be limited solely with respect to the appended claims and equivalents.

What is claimed is:

1. A process for producing relief copies comprising: exposing the light-hardenable layer of a light-hardenable copying material to a light image; said layer comprising at least one material selected from the group consisting of photopolymerizable mixtures, photodimerizable polymeric compounds and diazonium salt condensation products;

subjecting the exposed layer to immersion in an ultrasonic bath; and thereafter developing the layer by washing away unexposed areas of the layer with a developer.

2. A process according to claim 1, wherein said ultrasonic bath is at a temperature from about 4° C. to about 50° C.

3. A process according to claim 2, wherein said ultrasonic bath is at a temperature from about 15° C. to about 30° C.

4. A process according to claim 1, wherein said exposed layer is immersed in said ultrasonic bath for a period from about 5 seconds to about 40 minutes.

5. A process according to claim 4, wherein said exposed layer is immersed in said ultrasonic bath for a period from about 30 seconds to about 15 minutes.

6. A process according to claim 1, wherein said immersion is carried out within a period of up to one hour after said exposure step.

7. A process according to claim 1, wherein said light-hardenable copying material comprises a photopolymerizable layer, said layer comprising a polymerizable compound having at least two terminal ethylenically unsaturated double bonds, a polymeric binder, and a photoinitiator; said photoinitiator generating free radicals upon exposure to light.

8. A process according to claim 7, wherein said photopolymerizable layer further comprises a stabilizer for preventing dark polymerization.

9. A process according to claim 7, wherein said photopolymerizable layer comprises, by weight, from about 10 to about 80 percent polymerizable monomer, from about 20 to about 90 percent polymeric binder, and from about 0.01 to about 10 percent photoinitiator.

10. A process according to claim 9, wherein said photopolymerizable layer comprises, by weight, from about 20 to about 60 percent polymerizable monomer, from about 40 to about 80 percent polymeric binder, and from about 0.2 to about 5 percent photoinitiator.

11. A process according to claim 7, wherein said polymerizable monomer comprises an acrylate or methacrylate ester of a polyhydroxy compound.

12. A process according to claim 7, wherein said binder is soluble in aqueous alkaline solutions.

13. A process according to claim 7, wherein said photopolymerizable layer is provided with a cover layer for protecting the photopolymerizable layer against atmospheric oxygen.

14. A process according to claim 1, wherein said light-hardenable layer comprises a photodimerizable polymeric compound.

15. A process according to claim 14, wherein said photodimerizable compound comprises a cinnamic acid ester of a polyhydroxy compound.

16. A process according to claim 1, wherein said light-hardenable layer comprises a diazonium salt condensation product.

17. A process according to claim 16, wherein said diazonium salt condensation product is formed by condensing an aromatic diazonium salt with formaldehyde.

18. A process according to claim 16, wherein said light-hardenable layer comprises, by weight, from about 10 to 100 percent diazonium salt condensation product and from about 0 to about 90 percent water-insoluble resinous binder.

19. A process according to claim 1, wherein said copying material comprises a light-hardenable layer disposed on a support.

20. A process according to claim 19, wherein said support comprises an anodized aluminum plate.

21. A process according to claim 1, wherein said copying material is exposed by contact exposure through a transparent original.

22. A process according to claim 1, wherein said developer is an aqueous alkaline solution.

23. A process according to claim 1, wherein said copying material is exposed with laser light.

* * * * *